United States Patent
Che et al.

(10) Patent No.: US 9,831,669 B1
(45) Date of Patent: *Nov. 28, 2017

(54) APPARATUS, SYSTEM, AND METHOD FOR CONTROLLING POWER WITHIN A POWER-REDUNDANT SYSTEM

(71) Applicant: Juniper Networks, Inc., Sunnyvale, CA (US)

(72) Inventors: Thuan Che, Fremont, CA (US); Jaspal S. Gill, Tracy, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/091,451

(22) Filed: Apr. 5, 2016

Related U.S. Application Data

(63) Continuation of application No. 13/897,792, filed on May 20, 2013, now Pat. No. 9,350,169.

(51) Int. Cl.
*H02J 1/00* (2006.01)
*H02J 1/10* (2006.01)

(52) U.S. Cl.
CPC ................................. *H02J 1/10* (2013.01)

(58) Field of Classification Search
CPC ............................................. H02J 1/10
See application file for complete search history.

(56) References Cited

U.S. PATENT DOCUMENTS

| | | | | |
|---|---|---|---|---|
| 2006/0139825 A1* | 6/2006 | Kuo | .................... | H01L 27/0259 361/56 |
| 2011/0128657 A1* | 6/2011 | Akai | .................... | H01L 27/0285 361/56 |
| 2011/0194219 A1* | 8/2011 | Tailliet | ................ | H01L 27/0285 361/56 |
| 2013/0181624 A1* | 7/2013 | Kang | .................. | H05B 33/0851 315/200 R |
| 2013/0222954 A1* | 8/2013 | Demange | ............... | H02H 9/046 361/56 |
| 2013/0321963 A1* | 12/2013 | Lai | ...................... | H01L 27/0248 361/56 |

* cited by examiner

*Primary Examiner* — Daniel Cavallari
(74) *Attorney, Agent, or Firm* — FisherBroyles, LLP

(57) ABSTRACT

An apparatus may include a bus that electrically couples an electrical load to redundant power feeds. The apparatus may also include at least one capacitive component electrically coupled between first and second rails of the bus via both a conductive path and a resistive path that has substantially greater resistance than the conductive path. In addition, the apparatus may include a switching mechanism electrically coupled between the first and second rails of the bus that causes the capacitive component to charge through the conductive path until a threshold voltage on the first rail of the bus is reached. When the threshold voltage on the first rail of the bus is reached, the switching mechanism may close the conductive path and force the capacitive component to charge through the resistive path. Various other systems and methods are also disclosed.

20 Claims, 7 Drawing Sheets

APPARATUS, SYSTEM, AND METHOD FOR CONTROLLING POWER WITHIN A POWER-REDUNDANT SYSTEM

CROSS REFERENCE TO RELATED APPLICATION

This application is a continuation of U.S. application Ser. No. 13/897,792 filed 20 May 2013, the disclosure of which is incorporated, in its entirety, by this reference.

BACKGROUND

Certain computing systems, such as high-availability network routers and switches, are intended to operate continually without interruption. In many cases, these systems may be configured to receive power from multiple independent power feeds so that the failure of a single power feed does not impact system operation.

Unfortunately, power-redundant systems such as these may suffer from a variety of issues. For example, when a power-redundant system switches between power feeds (due to, e.g., a power-feed failure), the system may experience various power anomalies, such as voltage transients, that may cause the system to reset or fail. In addition, when a power-redundant system is first powered on or switches from a low-power feed to a high-power feed, various components within the system (such as bulk-input capacitors) may draw an amount of current that is equal to many times their maximum operating limit (a phenomenon known as "inrush current"). This large inrush current may cause damage to these components, potentially causing the system to reset or fail.

As such, the instant disclosure identifies a need for improved apparatuses, systems, and methods for controlling power within power-redundant systems.

SUMMARY

As will be described in greater detail below, the instant disclosure generally describes improved apparatuses, systems, and methods for controlling power within power-redundant systems. In one example, an apparatus for accomplishing such a task may include a bus that electrically couples an electrical load to redundant power feeds. The apparatus may also include at least one capacitive component electrically coupled between first and second rails of the bus via both a conductive path and a resistive path that has substantially greater resistance than the conductive path. In addition, the apparatus may include a switching mechanism electrically coupled between the first and second rails of the bus that causes the capacitive component to charge through the conductive path until a threshold voltage on the first rail of the bus is reached. When the threshold voltage on the first rail of the bus is reached, the switching mechanism may close the conductive path and force the capacitive component to charge through the resistive path.

Similarly, a system incorporating the above-described apparatus may include an electrical load, redundant power feeds, and a bus that electrically couples the electrical load to the redundant power feeds. The system may also include at least one capacitive component electrically coupled between first and second rails of the bus via a conductive path and a resistive path that has substantially greater resistance than the conductive path. In addition, the system may include a switching mechanism electrically coupled between the first and second rails of the bus that causes the capacitive component to charge through the conductive path until a threshold voltage on the first rail of the bus is reached. When the threshold voltage on the first rail of the bus is reached, the switching mechanism may close the conductive path and force the capacitive component to charge through the resistive path.

A corresponding method may include charging, in an apparatus that includes a bus that electrically couples an electrical load to redundant power feeds, a capacitive component through a conductive path that electrically couples the capacitive component between first and second rails of the bus until a threshold voltage on the first rail of the bus is reached. When the threshold voltage on the first rail of the bus is reached, the method may also include closing the conductive path and forcing the capacitive component to charge through a resistive path that also electrically couples the capacitive component between the first and second rails of the bus. In this example, the resistive path may have substantially greater resistance than the conductive path.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
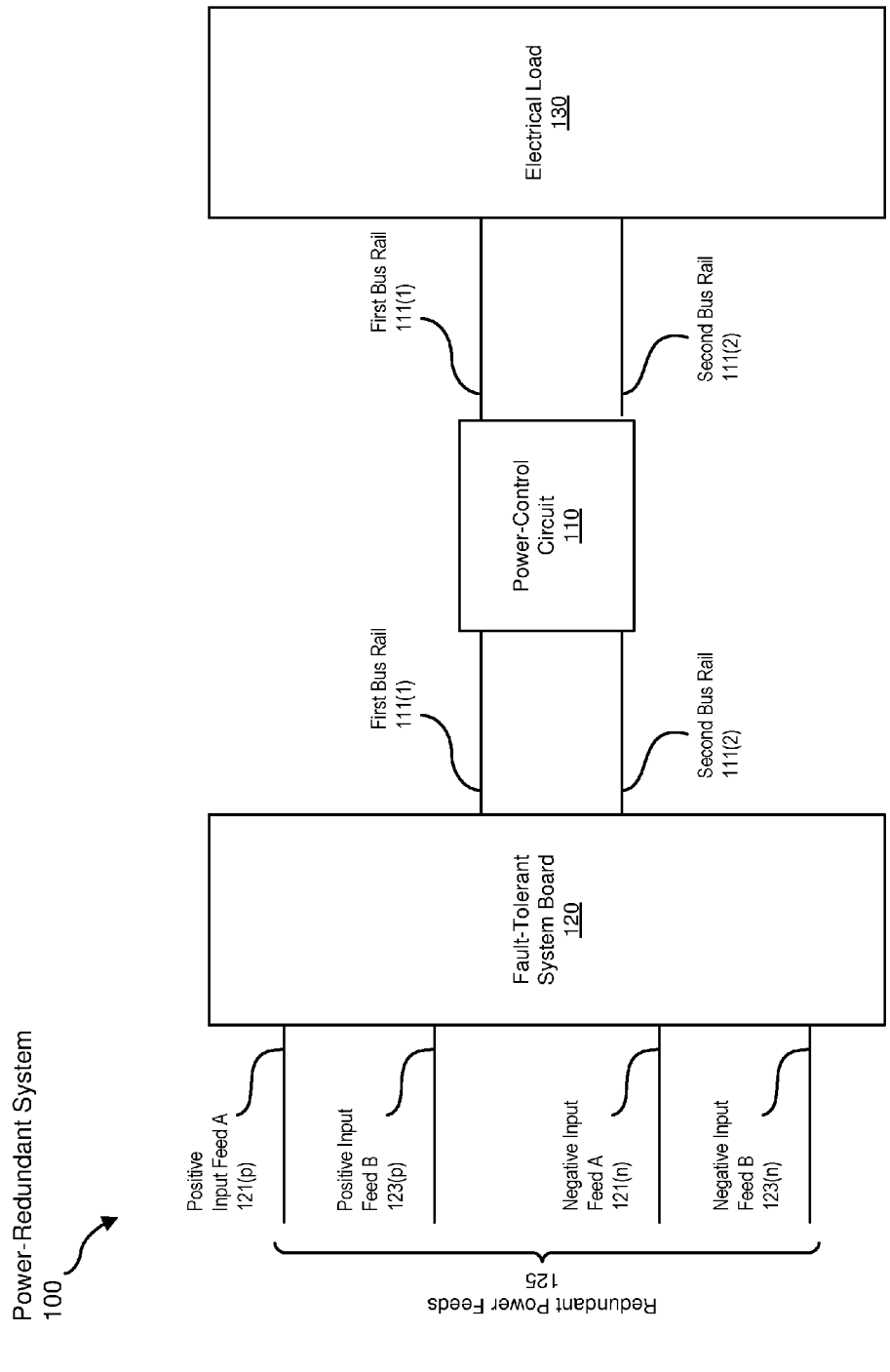
FIG. 1 is a block diagram of an exemplary power-redundant system including a power-control circuit capable of controlling power within the power-redundant system.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for controlling power within a power-redundant system. As will be explained in greater detail below, embodiments of the instant disclosure may effectively reduce or prevent the damaging effects of inrush current on a capacitive component of a power-redundant system by, for example, forcing this component to charge at a slower rate once a predetermined threshold voltage is reached. Embodiments of the instant disclosure may also effectively temper voltage transients within such a system by, for example, causing changes in voltage within the power-redundant system to occur more gradually.

The following will provide, with reference to FIGS. 1-4, examples of circuit board component placement that may result in a reduction of inrush current and a tempering of voltage transience within a power-redundant system. More particularly, the discussion corresponding to FIG. 1 will provide examples of systems that may include the components and circuits shown in FIGS. 2-4. In addition, the discussion corresponding to FIGS. 5 and 6 will respectively detail the charging behavior of a capacitive component and the voltage response of a bus rail within a power-redundant system controlled by a power-control circuit. The discussion corresponding to FIG. 7 will also provide a detailed description of an exemplary method for controlling power within a power-redundant system. Finally, the discussion corresponding to FIG. 8 will provide numerous examples of systems that may include the components and circuits shown in FIGS. 1-4.

FIG. 1 is a block diagram of an exemplary embodiment of a power-redundant system 100. The term "power-redundant system," as used herein, generally refers to any type or form of device or system capable of receiving power via a plurality of independent power feeds such that failure of a single power feed does not impact operation. Examples of power-redundant systems include, without limitation, network switches, network routers (e.g., backbone routers, edge routers, core routers, mobile service routers, broadband routers, etc.), network appliances (e.g., network security appliances, network control appliances, network timing appliances, SSL VPN (Secure Sockets Layer Virtual Private Network) appliances, etc.), network controllers, gateways (e.g., service gateways, mobile packet gateways, multi-access gateways, security gateways, etc.), distributed computing systems, servers, and/or any other type or form of computing system or device.

As shown in FIG. 1, power-redundant system 100 may include an electrical load 130 coupled to a fault-tolerant system board 120 via a power-control circuit 110. The term "electrical load," as used herein, generally refers to any type or form of device or component (or group of devices or components, such as, e.g., computing system 800 in FIG. 8, as detailed below) capable of consuming power. In one example, electrical load 130 may represent a hot-swap controller capable of enabling electrical components, such as electronic circuit boards or cards, to be inserted and/or removed from power-redundant system 100.

In addition, the term "fault-tolerant system board," as used herein, generally refers to any type or form of system or mechanism capable of providing power via a plurality of independent power feeds. An example of a fault-tolerant system board includes, without limitation, a diode array arranged in an "OR" gate configuration that provides power from multiple input feeds while preventing reverse-current flow.

In one example, fault-tolerant system board 120 may include a plurality of redundant power feeds 125. The term "power feed," as used herein, generally refers to any type or form of path for providing power to a system. Similarly, the term "redundant power feeds," as used herein, generally refers to a plurality of independent power feeds, each of which may be capable of individually providing power to an electrical load. In some examples, each of these redundant power feeds may supply a substantially identical amount of voltage. In other examples, however, one or more of these redundant power feeds may supply a substantially higher amount of voltage. For example, one of redundant power feeds 125 may supply 72V while another may only supply 40V.

As shown in FIG. 1, each of redundant power feeds 125 may include a positive input feed and a negative input feed. For example, fault-tolerant system board 120 may receive power from input feed A (including both positive input feed A 121($p$) and negative input feed A 121($n$)) and/or input feed B (including both positive input feed B 123($p$) and negative input feed B 123($n$)). As detailed above, fault-tolerant system board 120 may also include an input feed mechanism, such as a diode array arranged in an "OR" gate configuration, that allows power to be received from one or more sources. As such, fault-tolerant system board 120 may enable power-redundant system 100 to remain operational as long as at least one of redundant power feeds 125 supplies power to power-redundant system 100.

As detailed above, electrical load 130 may be coupled to fault-tolerant system board 120 (and thus redundant power feeds 125) via power-control circuit 110. The term "power-control circuit," as used herein, generally refers to any type or form of device or component (or group of devices or components) capable of controlling or regulating power. Detailed examples of power-control circuits will be provided in connection with FIGS. 2-4 below.

In one example, power-control circuit 110 may be electrically coupled between electrical load 130 and the redundant power feeds 125 of fault-tolerant system board 120 via a bus. The term "bus," as used herein, generally refers to any type or form of path (such as a conductive wire) for conducting electricity. In the example illustrated in FIG. 1, the bus that electrically couples power-control circuit 110 between fault-tolerant system board 120 and electrical load 130 may include a first bus rail 111(1) and a second bus rail 111(2). In this example, first bus rail 111(1) may have a positive voltage and second bus rail 111(2) may have a negative voltage. In other examples, the voltage of these rails may be reversed (i.e., first bus rail 111(1) may have a negative voltage and second bus rail 111(2) may have a positive voltage).

Figure 2:
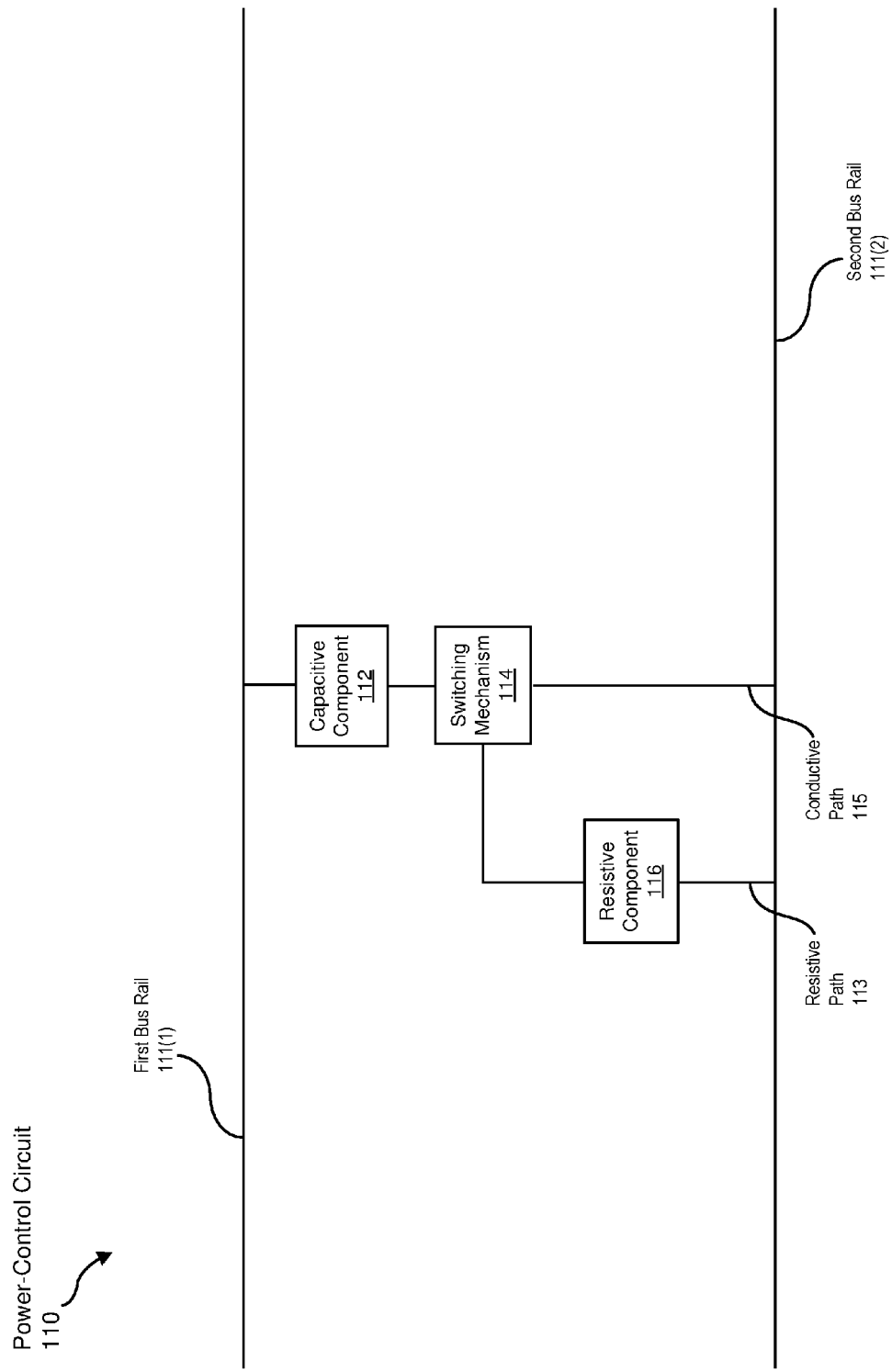
FIG. 2 is a block diagram of an exemplary power-control circuit capable of controlling power within a power-redundant system.
Figure 3:
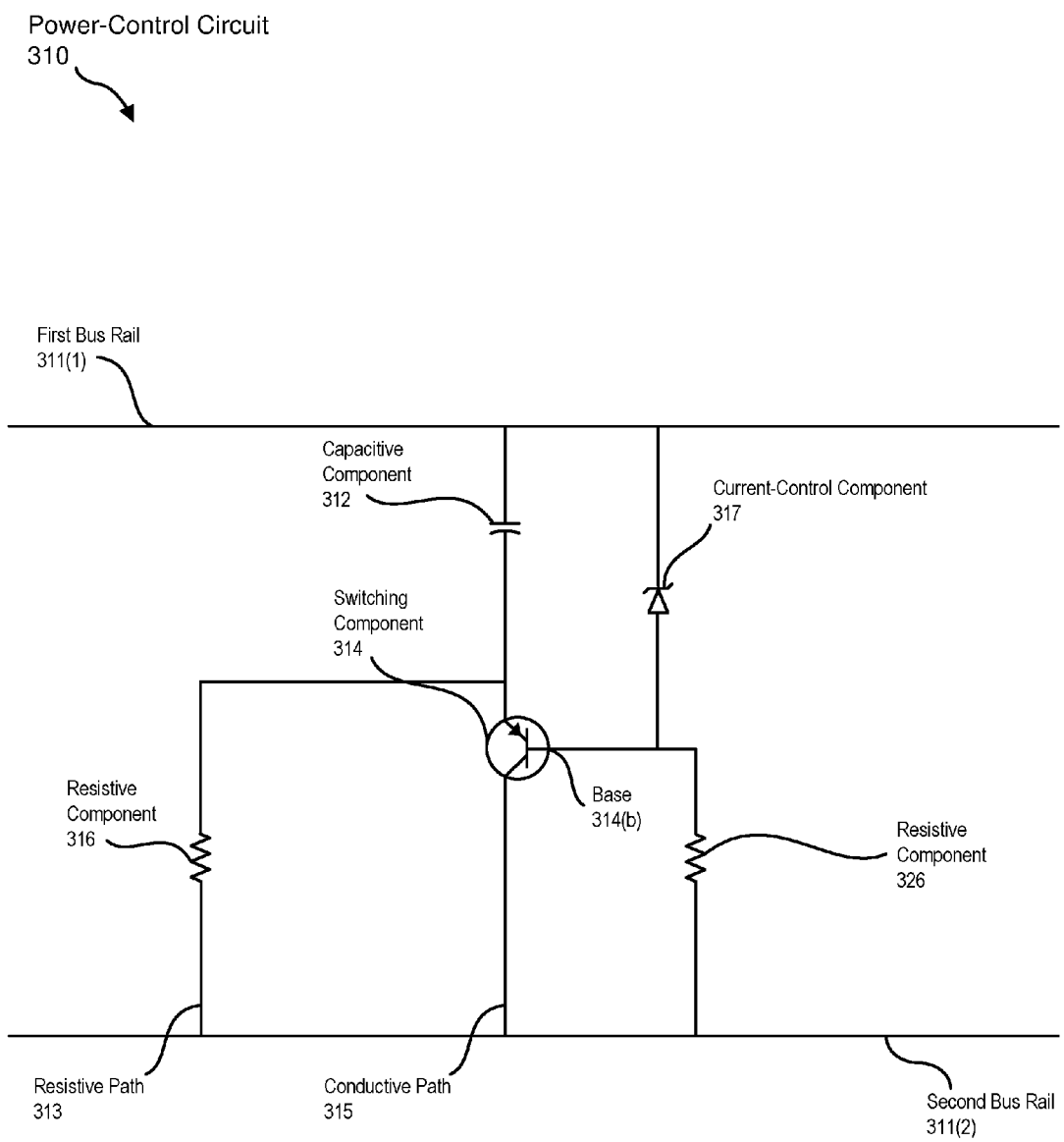
FIG. 3 is a schematic diagram of an exemplary power-control circuit capable of controlling power within a power-redundant system.
Figure 4:
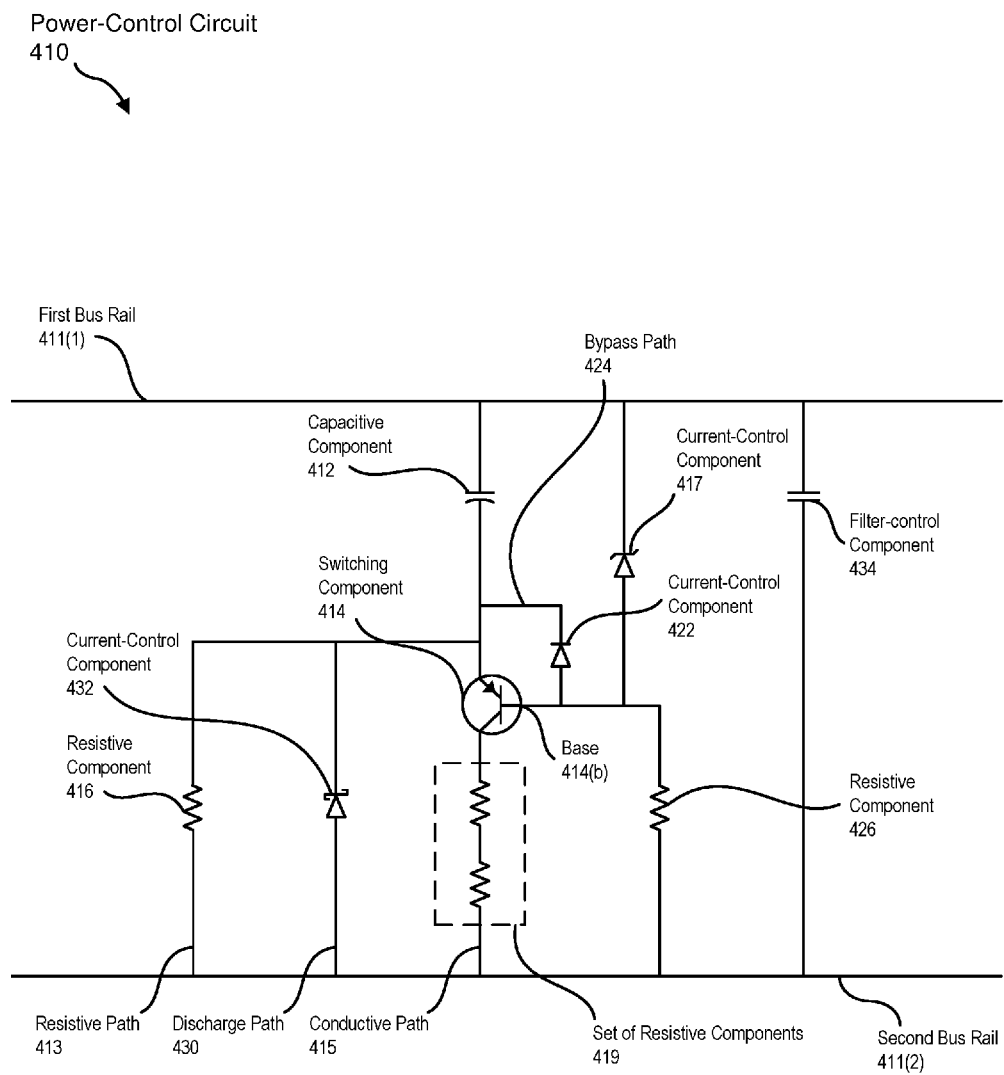
FIG. 4 is a schematic diagram of an additional exemplary power-control circuit capable of controlling power within a power-redundant system.

FIGS. 2-4 show exemplary embodiments of a power-control circuit that may be used to control power within a power-redundant system, such as power-redundant system 100 of FIG. 1. As shown in FIG. 2, power-control circuit 110 from FIG. 1 may include a bus (having a first bus rail 111(1) and a second bus rail 111(2)) that electrically couples electrical load 130 from FIG. 1 to redundant power feeds 125 of fault-tolerant system board 120 in FIG. 1. In this example, power-control circuit 110 may include at least one capacitive component 112 electrically coupled between first bus rail 111(1) and second bus rail 111(2) via both a conductive path 115 and a resistive path 114.

The term "capacitive component," as used herein, generally refers to any type or form of electrical component, or combination of electrical components, having capacitance. An example of a capacitive component includes, without limitation, a capacitor. In some examples, a desired capacitance of capacitive component 112 may be achieved using a plurality of capacitors arranged in parallel, in series, or both.

In addition, the term "path," as used herein, generally refers to any type or form of electrical path along which current may pass. Paths may include any of a variety of electrical components, including, without limitation, resistors, capacitors, inductors, transistors, diodes, memristors, and the like. In one example, the term "resistive path" may refer to a path whose effective resistance (due to, e.g., the presence of at least one resistive component) is substantially greater than the effective resistance of a corresponding "conductive path." That is to say, the terms "resistive path" and "conductive path," as used herein, may represent relative terms.

For example, resistive path 113 in FIG. 2 may (due to, e.g., the presence of at least one resistive component, such as resistive component 116) have substantially greater resistance than conductive path 115. The term "resistive component," as used herein, generally refers to any type or form of electrical component or combination of electrical components (such as a resistor or a set of resistors) having resistance. In one example, a desired resistance of resistive component 116 may be achieved using a single resistor or a plurality of resistors arranged in series, in parallel, or both.

In the example illustrated in FIG. 2, power-control circuit 110 may also include a switching mechanism 114 electrically coupled between first bus rail 111(1) and second bus rail 111(2). The term "switching mechanism," as used herein, generally refers to any type or form of electrical component, or combination of electrical components, capable of interrupting or diverting current from an electrical path. In the example illustrated in FIG. 2, switching mechanism 114 may be capable of directing current between resistive path 113 and conductive path 115.

For example, switching mechanism 114 may be configured to cause capacitive component 112 to charge through either conductive path 115 or resistive path 113 depending on the voltage value of first bus rail 111(1). For example, when power-redundant system 100 in FIG. 1 is powered on (or when an input-feed failure causes fault-tolerant system board 120 to switch from a lower-voltage input feed to a higher-voltage input feed, as described in greater detail below), switching mechanism 114 may cause capacitive component 112 to charge through conductive path 115 until a threshold voltage on first bus rail 111(1) is reached. In this example, the relatively low overall resistance of conductive path 115 may allow capacitive component 112 to quickly charge, which may in turn allow power to be quickly provided to electrical load 130.

However, when the threshold voltage is reached, switching mechanism 114 may close conductive path 115 and force capacitive component 112 to charge through resistive path 113. In this example, because the overall resistance of resistive path 113 may be substantially greater than the overall resistance of conductive path 115, capacitive component 112 may charge at a much slower rate through resistive path 113 than when charging through conductive path 115.

Figure 5:
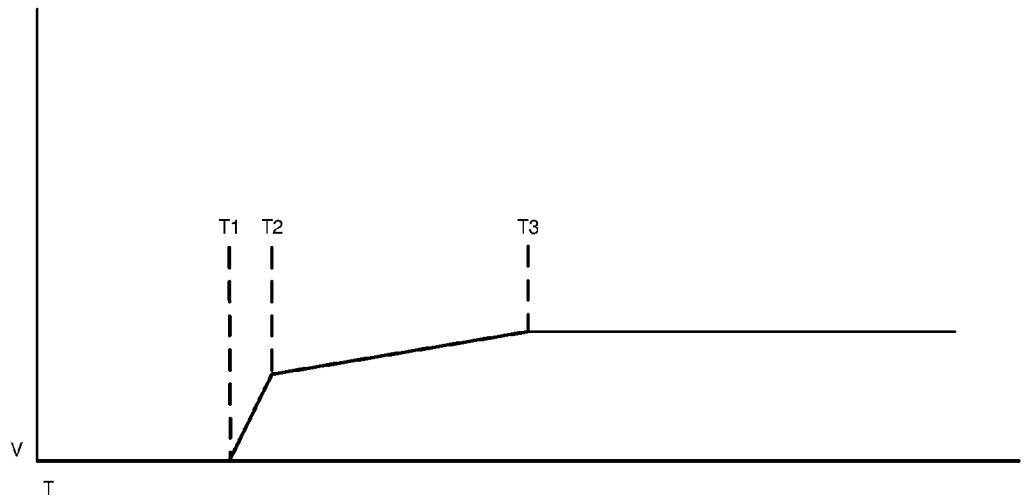
FIG. 5 is a graph illustrating exemplary charging behavior of a capacitive component controlled by the power-control circuit illustrated in FIG. 2.

FIG. 5 is an exemplary graph illustrating this behavior. As shown in this figure, the level of voltage across capacitive component 112 may quickly rise from time T1 to time T2 as capacitive component 112 charges through conductive path 115 (when, e.g., power-redundant system 110 in FIG. 1 is powered on). However, when the level of voltage on first bus rail 111(1) reaches the threshold voltage at time T2, switching mechanism 114 may close conductive path 115 and force capacitive component 112 to charge through resistive path 113 (which, as detailed above, may have a substantially greater overall resistance than conductive path 115). This may, in turn, cause capacitive component 112 to charge at a much slower rate, facilitating a more gradual rise in voltage across capacitive component 112 from time T2 to time T3. Although not illustrated in FIG. 5, a similar scenario may also occur when a lower-power input feed (e.g., a power feed that supplies less than the threshold voltage) fails, which may in turn cause fault-tolerant system board 120 in FIG. 1 to switch to a higher-voltage input feed (e.g., a power feed that supplies more than the threshold voltage).

In some examples, the value of the above-described threshold voltage may be chosen so as to reduce or prevent damage to capacitive component 112. For example, since inrush current is both related to a supplied voltage and decays rapidly with time, the value of this threshold voltage may be chosen so as to prevent capacitive component 112 from experiencing an inrush current that exceeds its operating limit. In examples where power-redundant system 100 represents a telecommunications system, the value of this threshold voltage may be 43V.

As detailed above, power-control circuit 110 may effectively reduce or prevent the damaging effects of inrush current on capacitive component 112 by forcing capacitive component 112 to charge at a slower rate once a predetermined threshold voltage is reached. This may in turn prevent power-redundant system 100 from restarting or failing during power-on and/or when switching from a lower-power input feed (e.g., a power feed that supplies less than the threshold voltage) to a higher-power input feed (e.g., a power feed that supplies more than the threshold voltage).

Figure 6:
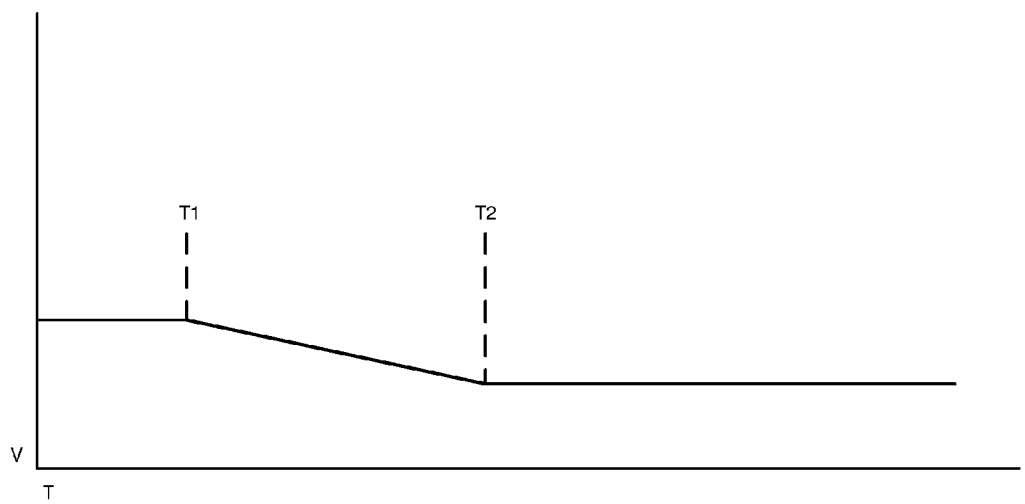
FIG. 6 is a graph demonstrating a gradual decrease in voltage on a rail of a bus controlled by the power-control circuit illustrated in FIG. 2 when a redundant power feed fails.

In some examples, power-control circuit 110 may also reduce or prevent system restarts or failure when power-redundant system 100 in FIG. 1 switches from a higher-voltage input feed to a lower-voltage input feed. For example, and as illustrated in FIG. 6, when power-redundant system 100 in FIG. 1 switches from a higher-voltage input feed to a lower-voltage input feed at time T1, capacitive component 112 may quickly provide power to electrical load 130 via first bus rail 111(1). This may in turn cause the voltage on first bus rail 111(1) to gradually (instead of immediately) decrease from time T1 to time T2, potentially reducing or preventing system restarts or failure.

Power-control circuit 110 may be implemented in a variety of ways using a variety of electrical components. FIG. 3 is an exemplary schematic diagram of one such implementation. As illustrated in this figure, the above-described switching mechanism may be implemented in power-control circuit 310 using at least one switching component 314 and at least one current-control component 317. As with switching mechanism 114 in FIG. 2, switching component 314 generally represents any type or form of electrical component, or combination of electrical components, capable of interrupting or diverting current from an electrical path. In one example, switching component 314 in FIG. 3 may represent a transistor, such as a PNP bipolar junction transistor. In this example, the base 314(b) of switching component 314 may be grounded via a resistive component 326 connected to second bus rail 311(2). In one example, resistive component 326 may have a resistance of 8.2KΩ.

The phrase "current-control component," as used herein, generally refers to any type or form of electrical component or combination of electrical components (such as a diode) having an asymmetric transfer characteristic that allows current to flow in a forward direction while impeding current in a reverse direction. In one example, current-control component 317 in FIG. 3 may represent a Zener diode electrically coupled between first bus rail 311(1) and the base 314(b) of switching component 314. In this example, current-control component 317 may impede the flow of current from first bus rail 311(1) to the base 314(b) of switching component 314 until a breakdown voltage of current-control component 317 (i.e., the above-described threshold voltage) is reached.

As detailed above, switching component 314 and current-control component 317 may collectively cause capacitive component 312 to charge through either conductive path 315 or resistive path 313 depending on the voltage value of first bus rail 311(1). For example, when a power-redundant system (such as power-redundant system 100 in FIG. 1) is powered on, switching component 314 may cause capacitive component 312 to charge through conductive path 315 (due to, e.g., switching component 314 being in its "on" state due to being grounded via resistive component 326). As detailed above, the relatively low resistance of conductive path 315 may allow capacitive component 312 to quickly charge, which may in turn allow power to be quickly provided to an electrical load (such as electrical load 130 in FIG. 1).

However, when the above-described threshold voltage (i.e., the breakdown voltage of current-control component 317) is reached, current-control component 317 may allow current to pass from first bus rail 311(1) to the base 314(b) of switching component 314. This may in turn cause switching component 314 to turn off and close conductive path 315, thereby forcing capacitive component 312 to charge through resistive path 313. As detailed above, because the overall resistance of resistive path 313 may be substantially greater than the overall resistance of conductive path 315, capacitive component 312 may charge at a much slower rate through resistive path 313 than when charging through conductive path 315, effectively reducing or preventing the damaging effects of inrush current on capacitive component 312.

In some examples, the power-control circuits described in connection with FIGS. 1-3 may be modified and/or tailored to achieve a variety of additional goals and/or realize additional desired functionality. FIG. 4 provides an illustration of an exemplary set of such modifications.

As shown in FIG. 4, power-control circuit 410 may have a conductive path 415 that includes at least one resistive component. For example, conductive path 415 may include a set of resistive components 419 arranged in series. In this example, the combined resistance of this set of resistive components 419 may be substantially less than the resistance of resistive component 416 in resistive path 413, such that the overall resistance of conductive path 415 is substantially less than the overall resistance of resistive path 413. For example, resistive component 416 of resistive path 413 may have a resistance of 100KΩ, while the set of resistive components 419 in conductive path 415 may have a combined resistance of 6.6KΩ.

In some examples, the combined resistance of the set of resistive components 419 in conductive path 415 may be chosen so as to reduce or prevent damage to capacitive component 412. For example, since inrush current is related to a supplied voltage, the combined resistance of this set of resistive components 419 may be chosen so as to prevent capacitive component 112 from experiencing an inrush current that exceeds its operating limit.

As shown in FIG. 4, power-control circuit 410 may also include a one-directional discharge path 430 that, in addition to resistive path 413 and conductive path 415, electrically couples capacitive component 412 between first bus rail 411(1) and second bus rail 411(1). In one example, discharge path 430 may include a current-control component 432 (such as a fast-switching Schottky diode) that only allows current to pass along discharge path 430 when capacitive component 412 discharges. Discharge path 430 may thus allow current to bypass resistive path 413 and conductive path 415 when capacitive component 412 discharges. Because the overall resistance of discharge path 430 may be substantially less than the overall resistances of both conductive path 415 and resistive path 413, capacitive component 412 may discharge through discharge path 430 at a much faster rate than would be possible when discharging through either conductive path 415 or resistive path 413. This may in turn allow capacitive component 412 to quickly provide power to an electrical load (such as electrical load 130 in FIG. 1) when an input-feed failure causes a fault-tolerant system board (such as fault-tolerant system board 120 in FIG. 1) to switch from a higher-voltage input feed to a lower-voltage input feed. As detailed above, this may in turn cause the voltage on first bus rail 411(1) to gradually (instead of immediately) decrease during this transition period, potentially reducing or preventing system restarts or failure.

As shown in FIG. 4, power-control circuit 410 may also include a bypass path 424 that includes a current-control component 422 (such as a diode) that only allows current to pass in a single direction. In one example, when the above-described threshold voltage on first bus rail 411(1) is reached and current-control component 417 allows current to pass from first bus rail 411(1) to the base 414(b) of switching component 414, current-control component 422 of bypass path 424 may allow at least a portion of this current to bypass switching component 414 along bypass path 424 to prevent this current form damaging switching component 414.

As shown in FIG. 4, power-control circuit 410 may also include at least one filter-control component 434 electrically coupled between first bus rail 411(1) and second bus rail 411(2). Filter-control component 434 generally represents any type or form of electrical component or combination of electrical components (such as a capacitor) having capacitance. In one example, filter-control component 434 may be electrically coupled directly between first bus rail 411(1) and second bus rail 411(2) proximate an output end of the same.

In some examples, filter-control component 434 may, in combination with capacitive component 412, supply power to an electrical load (such as electrical load 130 in FIG. 1) when an input-feed failure causes a power-redundant system (such as power-redundant system 100 in FIG. 1) to switch from a higher-voltage input feed to a lower-voltage input feed. As detailed above, this may in turn cause the voltage on first bus rail 411(1) to gradually (instead of immediately) decrease during this transition period, potentially reducing or preventing system restarts or failure.

In one example, filter-control component 434 may have a capacitance that is substantially less than the capacitance of capacitive component 412. For example, the capacitance of capacitive component 412 may be 1000 μF, while the capacitance of filter-control component 434 may be 200 μF. As such, the amount of inrush current experienced by filter-control component 434 may be substantially less than if the capacitance of filter-control component 434 were equivalent or similar to that of capacitive component 412.

Figure 7:
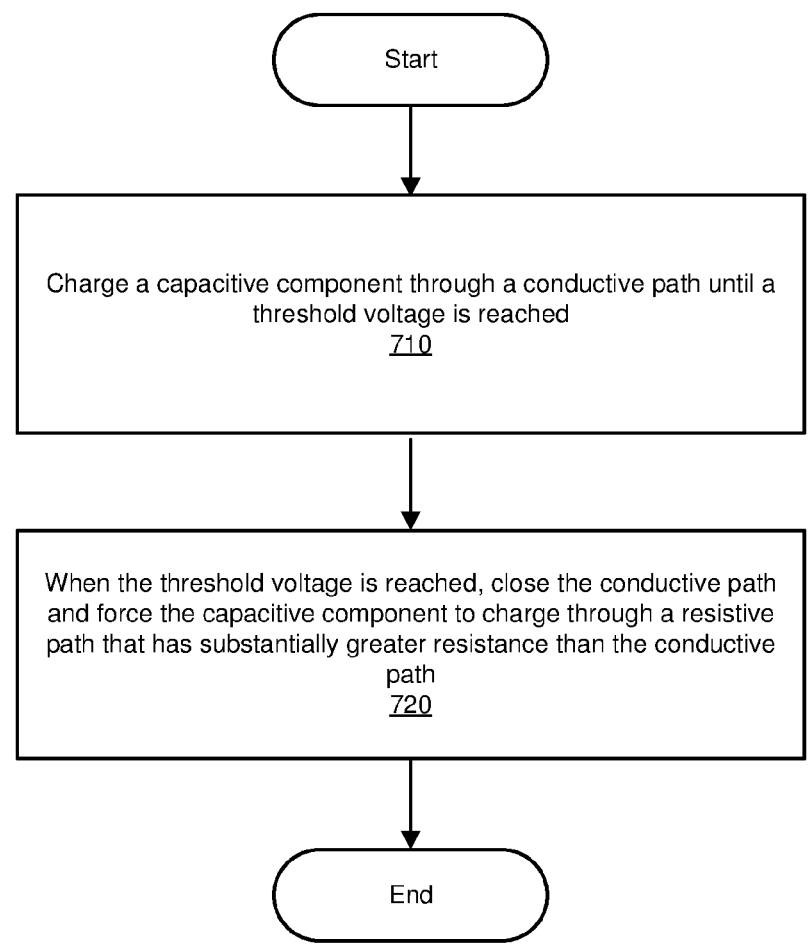
FIG. 7 is a flow diagram of an exemplary method for controlling power within a power-redundant system.

FIG. 7 is a flow diagram of an exemplary method 700 for controlling power within a power-redundant system using the power-control circuits described and/or illustrated herein. As shown in this figure, at step 710 an apparatus may cause a capacitive component to charge through a conductive path until a threshold voltage is reached. For example, as detailed above, switching mechanism 114 of power-control circuit 110 in FIG. 2 may cause capacitive component 112 to charge through conductive path 115 until a threshold voltage on first rail 111(1) is reached.

At step 720, when the threshold voltage is reached, the apparatus may close the conductive path and force the capacitive component to charge through a resistive path that has substantially greater resistance than the conductive path. For example, when the above-described threshold voltage on first bus rail 111(1) in FIG. 2 is reached, switching mechanism 114 of power-control circuit 110 may close conductive path 115 and force capacitive component 112 to charge through resistive path 113 (which may, as detailed above, have substantially greater resistance than conductive path 115).

As detailed above, the exemplary power-control circuits described and/or illustrated herein may effectively reduce or prevent the damaging effects of inrush current on a capacitive component of a power-redundant system by, for example, forcing this component to charge at a slower rate once a predetermined threshold voltage is reached. This may in turn prevent the power-redundant system from restarting or failing during power-on and/or when switching from a lower-power input feed (e.g., a power feed that supplies less than the threshold voltage) to a higher-power input feed (e.g., a power feed that supplies more than the threshold voltage). The exemplary power-control circuits described and/or illustrated herein may also effectively temper voltage transients by, for example, causing changes in voltage within the power-redundant system (due to, e.g., switching from a higher-power input feed to a lower-power input feed) to occur more gradually, again potentially reducing or preventing system restarts of failure.

Figure 8:
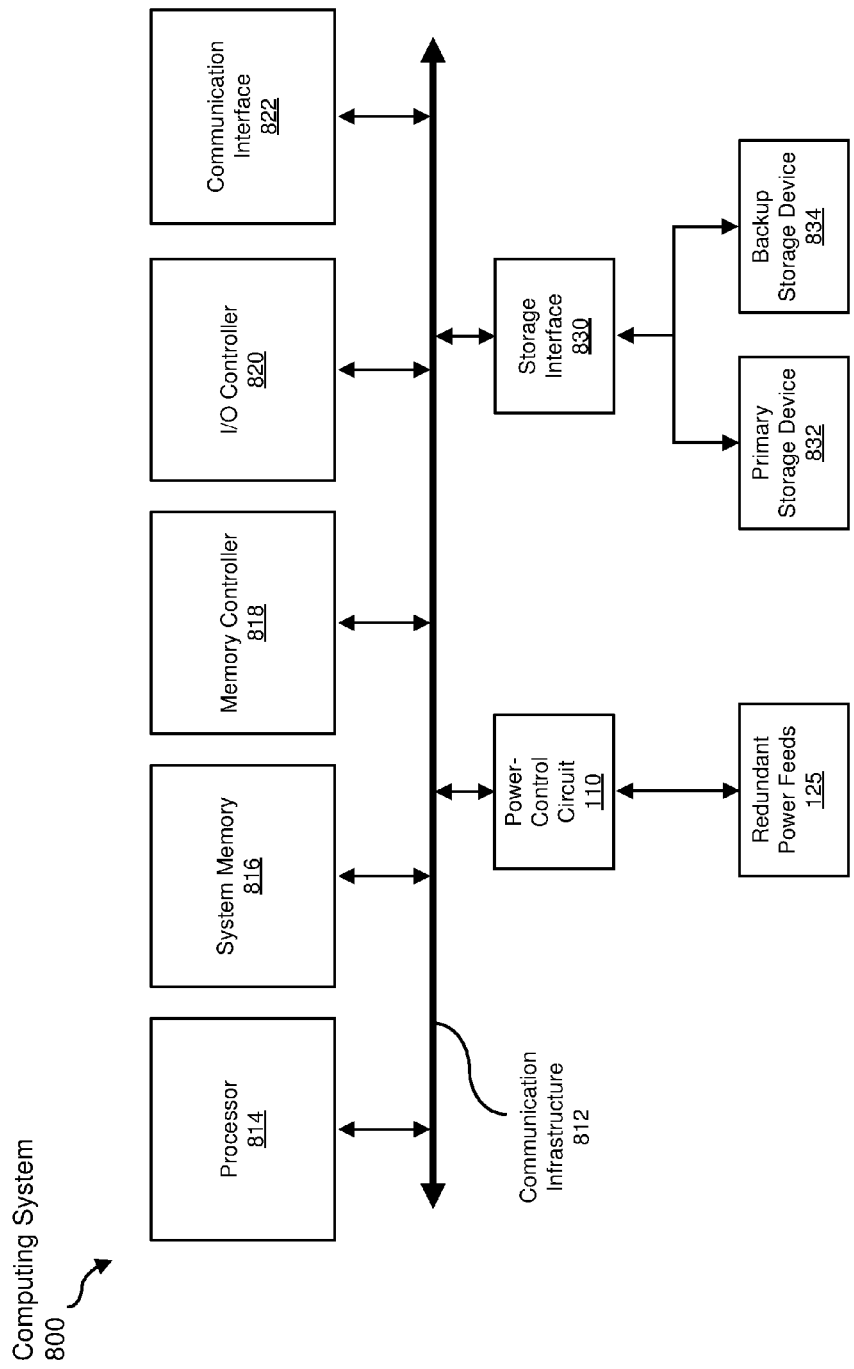
FIG. 8 is a block diagram of an exemplary computing system capable of implementing and/or being used in connection with one or more of the embodiments described and/or illustrated herein.

FIG. 8 is a block diagram of an exemplary computing system 800 incorporating one or more of the embodiments described and/or illustrated herein. In one example, computing system 800 may include a power-control circuit 110 capable of controlling power supplied by redundant power feeds 125 to communication infrastructure 812 of computing system 800.

Computing system 800 broadly represents any type or form of electrical load, including a single or multi-processor computing device or system capable of executing computer-readable instructions. Examples of computing system 800 include, without limitation, workstations, laptops, client-side terminals, servers, distributed computing systems, mobile devices, network switches, network routers (e.g., backbone routers, edge routers, core routers, mobile service routers, broadband routers, etc.), network appliances (e.g., network security appliances, network control appliances, network timing appliances, SSL VPN (Secure Sockets Layer Virtual Private Network) appliances, etc.), network controllers, gateways (e.g., service gateways, mobile packet gateways, multi-access gateways, security gateways, etc.), and/or any other type or form of computing system or device.

Computing system 800 may be programmed, configured, and/or otherwise designed to comply with one or more networking protocols. According to certain embodiments, computing system 800 may be designed to work with protocols of one or more layers of the Open Systems Interconnection (OSI) reference model, such as a physical layer protocol, a link layer protocol, a network layer protocol, a transport layer protocol, a session layer protocol, a presentation layer protocol, and/or an application layer protocol. For example, computing system 800 may include a network device configured according to a Universal Serial Bus (USB) protocol, an Institute of Electrical and Electronics Engineers (IEEE) 1394 protocol, an Ethernet protocol, a T1 protocol, a Synchronous Optical Networking (SONET) protocol, a Synchronous Digital Hierarchy (SDH) protocol, an Integrated Services Digital Network (ISDN) protocol, an Asynchronous Transfer Mode (ATM) protocol, a Point-to-Point Protocol (PPP), a Point-to-Point Protocol over Ethernet (PPPoE), a Point-to-Point Protocol over ATM (PPPoA), a Bluetooth protocol, an IEEE 802.XX protocol, a frame relay protocol, a token ring protocol, a spanning tree protocol, and/or any other suitable protocol.

Computing system 800 may include various network and/or computing components. For example, computing system 800 may include at least one processor 814 and a system memory 816. Processor 814 generally represents any type or form of processing unit capable of processing data or interpreting and executing instructions. Processor 814 may represent an application-specific integrated circuit (ASIC), a system on a chip (e.g., a network processor), a hardware accelerator, a general purpose processor, and/or any other suitable processing element.

Processor 814 may process data according to one or more of the networking protocols discussed above. For example, processor 814 may execute or implement a portion of a protocol stack, may process packets, may perform memory operations (e.g., queuing packets for later processing), may execute end-user applications, and/or may perform any other processing tasks.

System memory 816 generally represents any type or form of volatile or non-volatile storage device or medium capable of storing data and/or other computer-readable instructions. Examples of system memory 816 include, without limitation, Random Access Memory (RAM), Read Only Memory (ROM), flash memory, or any other suitable memory device. Although not required, in certain embodiments computing system 800 may include both a volatile memory unit (such as, for example, system memory 816) and a non-volatile storage device (such as, for example, primary storage device 832, as described in detail below). System memory 816 may be implemented as shared memory and/or distributed memory in a network device. Furthermore, system memory 816 may store packets and/or other information used in networking operations.

In certain embodiments, exemplary computing system 800 may also include one or more components or elements in addition to processor 814 and system memory 816. For example, as illustrated in FIG. 8, computing system 800 may include a memory controller 818, an Input/Output (I/O) controller 820, and a communication interface 822, each of which may be interconnected via communication infrastructure 812. Communication infrastructure 812 generally represents any type or form of infrastructure capable of facilitating communication between one or more components of a computing device. Examples of communication infrastructure 812 include, without limitation, a communication bus (such as a Serial ATA (SATA), an Industry Standard Architecture (ISA), a Peripheral Component Interconnect (PCI), a PCI Express (PCIe), and/or any other suitable bus), and a network.

Memory controller 818 generally represents any type or form of device capable of handling memory or data or controlling communication between one or more components of computing system 800. For example, in certain embodiments memory controller 818 may control communication between processor 814, system memory 816, and I/O controller 820 via communication infrastructure 812. In some embodiments, memory controller 818 may include a Direct Memory Access (DMA) unit that may transfer data (e.g., packets) to or from a link adapter.

I/O controller 820 generally represents any type or form of device or module capable of coordinating and/or controlling the input and output functions of a computing device. For example, in certain embodiments I/O controller 820 may control or facilitate transfer of data between one or more elements of computing system 800, such as processor 814, system memory 816, communication interface 822, and storage interface 830.

Communication interface 822 broadly represents any type or form of communication device or adapter capable of facilitating communication between exemplary computing system 800 and one or more additional devices. For example, in certain embodiments communication interface 822 may facilitate communication between computing system 800 and a private or public network including additional computing systems. Examples of communication interface 822 include, without limitation, a link adapter, a wired network interface (such as a network interface card), a wireless network interface (such as a wireless network interface card), and any other suitable interface. In at least one embodiment, communication interface 822 may provide a direct connection to a remote server via a direct link to a network, such as the Internet. Communication interface 822 may also indirectly provide such a connection through, for example, a local area network (such as an Ethernet network), a personal area network, a wide area network, a private network (e.g., a virtual private network), a telephone or cable network, a cellular telephone connection, a satellite data connection, or any other suitable connection.

In certain embodiments, communication interface 822 may also represent a host adapter configured to facilitate communication between computing system 800 and one or more additional network or storage devices via an external bus or communications channel. Examples of host adapters include, without limitation, Small Computer System Interface (SCSI) host adapters, Universal Serial Bus (USB) host adapters, IEEE 1394 host adapters, Advanced Technology Attachment (ATA), Parallel ATA (PATA), Serial ATA (SATA), and External SATA (eSATA) host adapters, Fibre Channel interface adapters, Ethernet adapters, or the like. Communication interface 822 may also enable computing system 800 to engage in distributed or remote computing. For example, communication interface 822 may receive instructions from a remote device or send instructions to a remote device for execution.

As illustrated in FIG. 8, exemplary computing system 800 may also include a primary storage device 832 and/or a backup storage device 834 coupled to communication infrastructure 812 via a storage interface 830. Storage devices 832 and 834 generally represent any type or form of storage device or medium capable of storing data and/or other computer-readable instructions. For example, storage devices 832 and 834 may represent a magnetic disk drive (e.g., a so-called hard drive), a solid state drive, a floppy disk drive, a magnetic tape drive, an optical disk drive, a flash drive, or the like. Storage interface 830 generally represents any type or form of interface or device for transferring data between storage devices 832 and 834 and other components of computing system 800.

In certain embodiments, storage devices 832 and 834 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 832 and 834 may also include other similar structures or devices for allowing computer software, data, or other computer-readable instructions to be loaded into computing system 800. For example, storage devices 832 and 834 may be configured to read and write software, data, or other computer-readable information. Storage devices 832 and 834 may be a part of computing system 800 or may be separate devices accessed through other interface systems.

Many other devices or subsystems may be connected to computing system 800. Conversely, all of the components and devices illustrated in FIG. 8 need not be present to practice the embodiments described and/or illustrated herein. The devices and subsystems referenced above may also be interconnected in different ways from those shown in FIG. 8. Computing system 800 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable-storage medium. The phrase "computer-readable-storage medium" generally refers to any form of device, carrier, or medium capable of storing or carrying computer-readable instructions. Examples of computer-readable-storage media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and other distribution systems.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of power-redundant system 100 in FIG. 1 may represent portions of a cloud-computing or network-based environment. Cloud-computing and network-based environments may provide various services and applications via the Internet. These cloud-computing and network-based services (e.g., software as a service, platform as a service, infrastructure as a service, etc.) may be accessible through a web browser or other remote interface. Various functions described herein may also provide network switching capabilities, gateway access capabilities, network security functions, content caching and delivery services for a network, network control services, and/or and other networking functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
  a bus that electrically couples an electrical load to redundant power feeds, the bus comprising a first rail and a second rail;
  a switching mechanism; and
  at least one capacitive component electrically coupled between the first rail of the bus and the switching mechanism, wherein the switching mechanism:
    is electrically coupled between the capacitive component and the second rail of the bus;
    causes the capacitive component to charge at a first rate until a threshold voltage is reached on the first rail of the bus; and
    causes the capacitive component to charge at a second rate that is slower than the first rate after the threshold voltage is reached on the first rail of the bus to protect the capacitive component against damage caused by inrush current.

2. The apparatus of claim 1, wherein:
  the switching mechanism comprises:
    at least one switching component; and
    at least one current-control component electrically coupled between the switching component and the first rail of the bus, wherein:
      the current-control component allows current to pass from the first rail of the bus to the switching component only after the threshold voltage is reached on the first rail of the bus; and
      when the current-control component allows current to pass from the first rail of the bus to the switching component, the switching component closes a conductive path and forces the capacitive component to charge through a resistive path, the resistive path having substantially greater resistance than the conductive path; and
  the resistive path comprises at least one resistive component electrically coupled between the switching mechanism and the second rail of the bus.

3. The apparatus of claim 2, wherein at least one of:
  the current-control component comprises a Zener diode;
  the resistive component comprises at least one resistor; and
  the switching component comprises a transistor.

4. The apparatus of claim 2, further comprising an additional current-control component that, when the current-control component allows current to pass from the first rail of the bus to the switching component, allows a portion of this current to bypass the switching component along a one-directional bypass path.

5. The apparatus of claim 1, further comprising a resistive path that includes at least one resistive component.

6. The apparatus of claim 5, further comprising a conductive path that includes at least one resistive component; and
  wherein the resistive component of the resistive path has substantially greater resistance than the resistive component of the conductive path.

7. The apparatus of claim 1, wherein:
  the capacitive component is also electrically coupled between the first and second rails of the bus via a one-directional discharge path; and
  the one-directional discharge path comprises at least one current-control component that allows current to pass along the one-directional discharge path only when the capacitive component discharges.

8. The apparatus of claim 7, wherein the current-control component comprises a Schottky diode.

9. The apparatus of claim 1, further comprising at least one filter-control component electrically coupled between the first and second rails of the bus.

10. The apparatus of claim 9, wherein the filter-control component comprises a capacitor having a capacitance that is substantially less than the capacitance of the capacitive component.

11. The apparatus of claim 9, wherein the filter-control component is electrically coupled directly between the first and second rails of the bus proximate to an output end of the first and second rails of the bus.

12. The apparatus of claim 1, wherein the threshold voltage is approximately 43 volts.

13. A system comprising:
  an electrical load;
  redundant power feeds;
  a bus that electrically couples the electrical load to the redundant power feeds, the bus comprising a first rail and a second rail;
  a switching mechanism; and
  at least one capacitive component electrically coupled between the first rail of the bus and the switching mechanism, wherein the switching mechanism:
    is electrically coupled between the capacitive component and the second rail of the bus;
    causes the capacitive component to charge at a first rate until a threshold voltage is reached on the first rail of the bus; and
    causes the capacitive component to charge at a second rate that is slower than the first rate after the threshold voltage is reached on the first rail of the bus to protect the capacitive component against damage caused by inrush current.

14. The system of claim 13, wherein:
  the switching mechanism comprises:
    at least one switching component; and
    at least one current-control component electrically coupled between the switching component and the first rail of the bus, wherein:

the current-control component allows current to pass from the first rail of the bus to the switching component only after the threshold voltage is reached on the first rail of the bus; and when the current-control component allows current to pass from the first rail of the bus to the switching component, the switching component closes a conductive path and forces the capacitive component to charge through a resistive path, the resistive path having substantially greater resistance than the conductive path; and the resistive path comprises at least one resistive component electrically coupled between the switching mechanism and the second rail of the bus.

15. The system of claim 14, further comprising an additional current-control component that, when the current-control component allows current to pass from the first rail of the bus to the switching component, allows a portion of this current to bypass the switching component along a one-directional bypass path.

16. The system of claim 13, wherein:
the capacitive component is also electrically coupled between the first and second rails of the bus via a one-directional discharge path; and
the one-directional discharge path comprises at least one current-control component that allows current to pass along the one-directional discharge path only when the capacitive component discharges.

17. The system of claim 13, further comprising:
a conductive path that includes at least one resistive component; and
a resistive path comprises at least one resistive component that has substantially greater resistance than the resistive component of the conductive path.

18. The system of claim 13, further comprising at least one filter-control component electrically coupled between the first and second rails of the bus, the filter-control component comprising a capacitor having a capacitance that is substantially less than the capacitance of the capacitive component.

19. The system of claim 18, wherein the filter-control component is electrically coupled directly between the first and second rails of the bus proximate to an output end of the first and second rails of the bus.

20. A method comprising:
electrically coupling an electrical load to redundant power feeds by way of a bus that comprises a first rail and a second rail;
electrically coupling at least one capacitive component between the first rail of the bus and a switching mechanism, wherein the switching mechanism:
is electrically coupled between the capacitive component and the second rail of the bus;
causes the capacitive component to charge at a first rate until a threshold voltage is reached on the first rail of the bus; and
causes the capacitive component to charge at a second rate that is slower than the first rate after the threshold voltage is reached on the first rail of the bus to protect the capacitive component against damage caused by inrush current.

\* \* \* \* \*